United States Patent
Wen et al.

(10) Patent No.: US 9,847,329 B2
(45) Date of Patent: Dec. 19, 2017

(54) STRUCTURE OF FIN FEATURE AND METHOD OF MAKING SAME

(71) Applicant: Taiwan Semiconductor Manufacturing Company, Ltd., Hsin-Chu (TW)

(72) Inventors: Tsung-Yao Wen, Hsinchu (TW); Bo-Yu Lai, Hsin-Chu (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 23 days.

(21) Appl. No.: 14/477,311

(22) Filed: Sep. 4, 2014

(65) Prior Publication Data
US 2016/0071846 A1    Mar. 10, 2016

(51) Int. Cl.
| | |
|---|---|
| *H01L 27/088* | (2006.01) |
| *H01L 21/311* | (2006.01) |
| *H01L 21/8234* | (2006.01) |
| *H01L 29/66* | (2006.01) |
| *H01L 29/06* | (2006.01) |
| *H01L 29/04* | (2006.01) |

(52) U.S. Cl.
CPC .. *H01L 27/0886* (2013.01); *H01L 21/823412* (2013.01); *H01L 21/823431* (2013.01); *H01L 21/823481* (2013.01); *H01L 29/04* (2013.01); *H01L 29/0649* (2013.01); *H01L 29/6656* (2013.01); *H01L 29/6681* (2013.01)

(58) Field of Classification Search
USPC ........................................................ 438/283
See application file for complete search history.

(56) References Cited

U.S. PATENT DOCUMENTS

| | | | |
|---|---|---|---|
| 2011/0049613 A1 | 3/2011 | Yeh et al. | |
| 2011/0068405 A1 | 3/2011 | Yuan et al. | |
| 2013/0082304 A1 | 4/2013 | Liu et al. | |
| 2013/0200470 A1* | 8/2013 | Liu .................. | H01L 29/66795 257/408 |
| 2013/0224936 A1* | 8/2013 | Lee ................. | H01L 21/823821 438/492 |

FOREIGN PATENT DOCUMENTS

KR    20130036694    4/2013

OTHER PUBLICATIONS

Korean Intellectual Property Office, Notice of Allowance, Application No. 10-2014-0182412, dated Jun. 10, 2016, 6 pages—with English Translation and Summary.

* cited by examiner

*Primary Examiner* — Fernando L Toledo
*Assistant Examiner* — Lawrence-Linh T Nguyen
(74) *Attorney, Agent, or Firm* — Haynes and Boone, LLP

(57) ABSTRACT

A semiconductor device includes a first fin feature embedded within an isolation structure disposed over a semiconductor substrate, the first fin structure having a first sidewall and a second opposing sidewall and a top surface extending from the first sidewall to the second sidewall. The device also includes a second fin feature disposed over the isolation structure and having a third sidewall and a fourth sidewall. The third sidewall is aligned with the first sidewall of the first fin structure. The device also includes a gate dielectric layer disposed directly on the top surface of the first fin structure, the third sidewall and the fourth sidewall of the second fin feature and a gate electrode disposed over the gate dielectric.

20 Claims, 15 Drawing Sheets

STRUCTURE OF FIN FEATURE AND METHOD OF MAKING SAME

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, a three dimensional transistor, such as a fin-type field-effect transistor (FinFET), has been introduced to replace a planar transistor. Although existing FinFET devices and methods of fabricating FinFET devices have been generally adequate for their intended purposes, they have not been entirely satisfactory in all respects. For example, a fin feature with smaller width is desired.

BRIEF DESCRIPTION OF THE DRAWINGS

Aspects of the present disclosure are best understood from the following detailed description when read in association with the accompanying figures. It is noted that, in accordance with the standard practice in the industry, various features in drawings are not drawn to scale. In fact, the dimensions of illustrated features may be arbitrarily increased or decreased for clarity of discussion.

FIGS. 1 to 4A-4B are cross-sectional views of an example semiconductor device in accordance with some embodiments.

DETAILED DESCRIPTION

Figure 1:
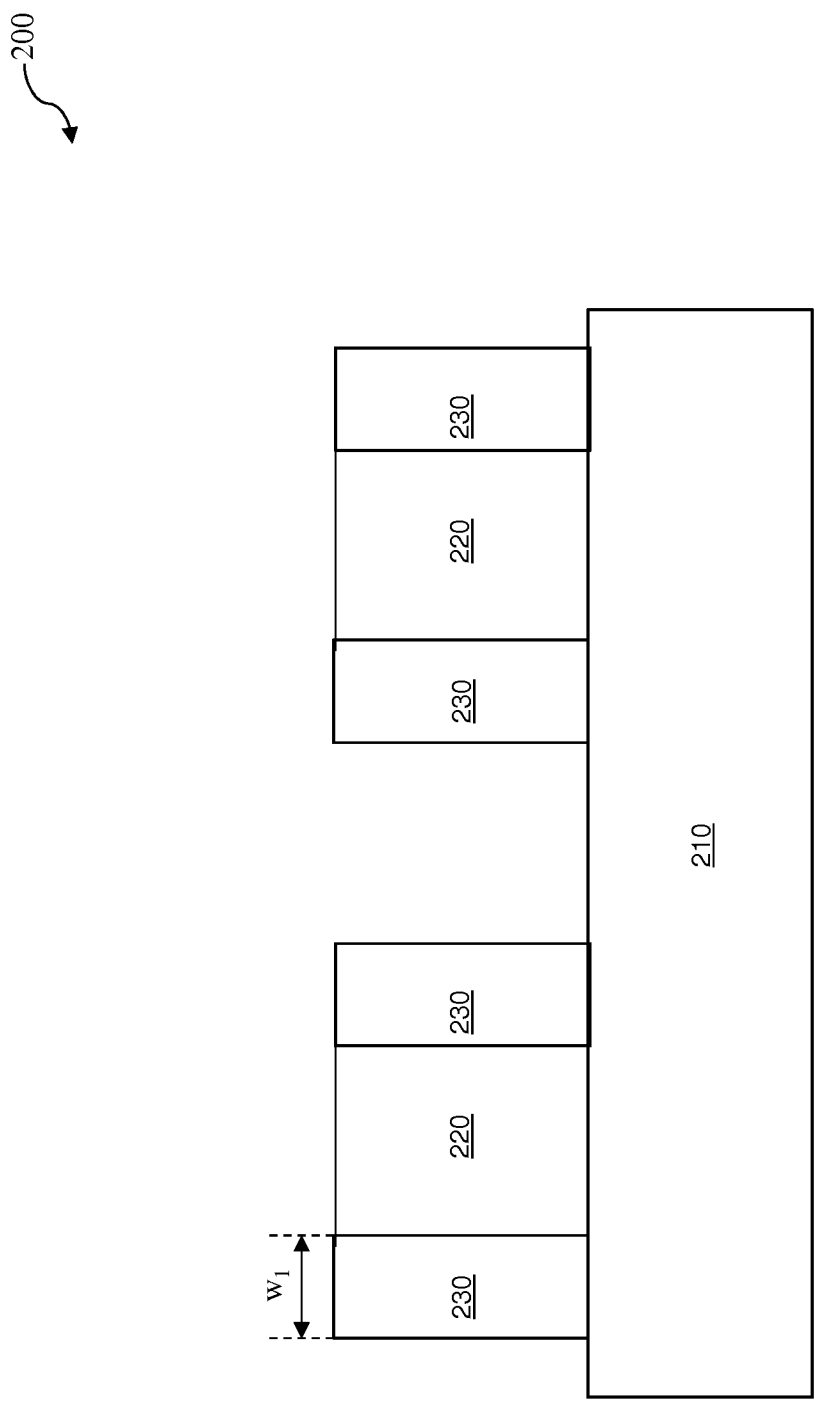

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is directed to, but not otherwise limited to, a FinFET device. The FinFET device, for example, may be a complementary metal-oxide-semiconductor (CMOS) device comprising a P-type metal-oxide-semiconductor (PMOS) FinFET device and an N-type metal-oxide-semiconductor (NMOS) FinFET device. The following disclosure will continue with a FinFET example to illustrate various embodiments of the present invention. It is understood, however, that the application should not be limited to a particular type of device, except as specifically claimed.

FIGS. 1 through 11 are cross-sectional views and perspective views of intermediate stages in the manufacturing of a semiconductor device 200 in accordance with some example embodiments. FIG. 1 illustrates a cross-sectional view of an initial structure. The initial structure includes a substrate 210. Substrate 210 may be a bulk silicon substrate. Alternatively, the substrate 210 may comprise an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide; or combinations thereof. Possible substrates 210 also include a silicon-on-insulator (SOI) substrate. SOI substrates are fabricated using separation by implantation of oxygen (SIMOX), wafer bonding, and/or other suitable methods.

Some exemplary substrates 210 also include an insulator layer. The insulator layer comprises any suitable material, including silicon oxide, sapphire, and/or combinations thereof. An exemplary insulator layer may be a buried oxide layer (BOX). The insulator is formed by any suitable process, such as implantation (e.g., SIMOX), oxidation, deposition, and/or other suitable process. In some exemplary FinFET precursors 200, the insulator layer is a component (e.g., layer) of a silicon-on-insulator substrate.

The substrate 210 may also include various doped regions. The doped regions may be doped with p-type dopants, such as boron or $BF_2$; n-type dopants, such as phosphorus or arsenic; or combinations thereof. The doped regions may be formed directly on the substrate 210, in a P-well structure, in an N-well structure, in a dual-well structure, or using a raised structure. The substrate 210 may further include various active regions, such as regions configured for an N-type metal-oxide-semiconductor transistor device and regions configured for a P-type metal-oxide-semiconductor transistor device.

A plurality of mandrel features 220 are formed over the substrate 210. In one embodiment, the mandrel features 220 are formed by depositing a mandrel material layer, such as a dielectric material (silicon oxide, silicon nitride for examples); forming a patterned photo resist layer over the mandrel material layer; and etching the mandrel material layer using the patterned resist layer as an etch mask, thereby forming the mandrel features 220. The mandrel material may be deposited by various methods, including thermal oxidation, a chemical vapor deposition (CVD) process, plasma enhanced CVD (PECVD), atomic layer deposition (ALD), and/or other methods known in the art. An exemplary photolithography process includes forming a photoresist layer (resist) overlying the substrate (e.g., on a silicon layer), exposing the resist to a pattern, performing a post-exposure bake process, and developing the resist to form a masking element including the resist. The masking element is then used to etch the mandrel material to form the mandrel feature 220. The etching process a wet etch, a dry etch, and/or a combination thereof.

A plurality of first spacers 230 are formed on sidewalls of the mandrel features 220. In one embodiment, the formation of the first spacer 230 includes depositing a first spacer material layer on the substrate 210 and the mandrel features 220, and thereafter performing an anisotropic etch to the first spacer material layer, thereby forming the first spacer 230. In the present embodiment, the first spacer material layer may include a first semiconductor material, such as germanium (Ge), silicon (Si), gallium arsenide (GaAs), aluminum gallium arsenide (AlGaAs), silicon germanium (SiGe), gallium arsenide phosphide (GaAsP), gallium antimony (GaSb), indium antimony (InSb), indium gallium arsenide (InGaAs), indium arsenide (InAs), or other suitable materials. The first spacer material layer may be deposited by epitaxial growing processes, such as CVD deposition techniques (e.g., vapor-phase epitaxy (VPE) and/or ultra-high vacuum CVD (UHV-CVD)), molecular beam epitaxy, and/or other suitable processes. An anisotropic dry etch is then performed by using such mechanisms as DRIE (deep reactive-ion etching) with a chlorine-based chemistry. Other dry etchant gasses include $CF_4$, $NF_3$, $SF_6$, and He. The first spacer 230 is formed with a first width $w_1$ by controlling a thickness of the first spacer material layer. In the present embodiment, a first width $w_1$ of the first spacer 230 is designed as a width of a first fin feature, which will be described later.

Figure 2:
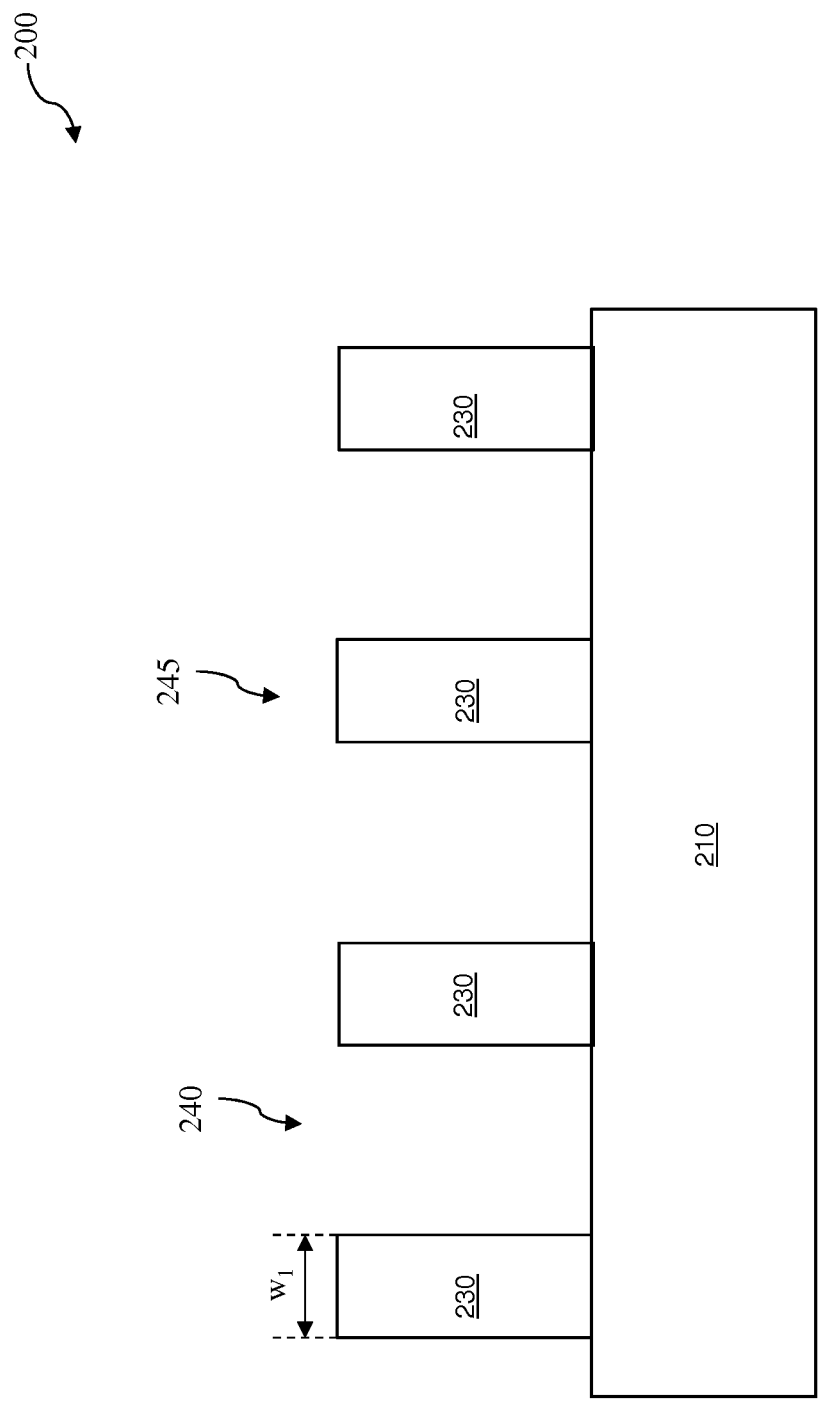

FIG. 2 illustrates first trenches 240 are formed by removing the mandrel features 220 while the first spacer 230 is intact. In the present embodiment, the mandrel features 220 may be removed by a selective etch, including a selective wet etch, a selective dry etch, and/or combination thereof. The remaining first spacers 230 are referred to as a first fin feature 245 and have the first width $w_1$.

Figure 3:
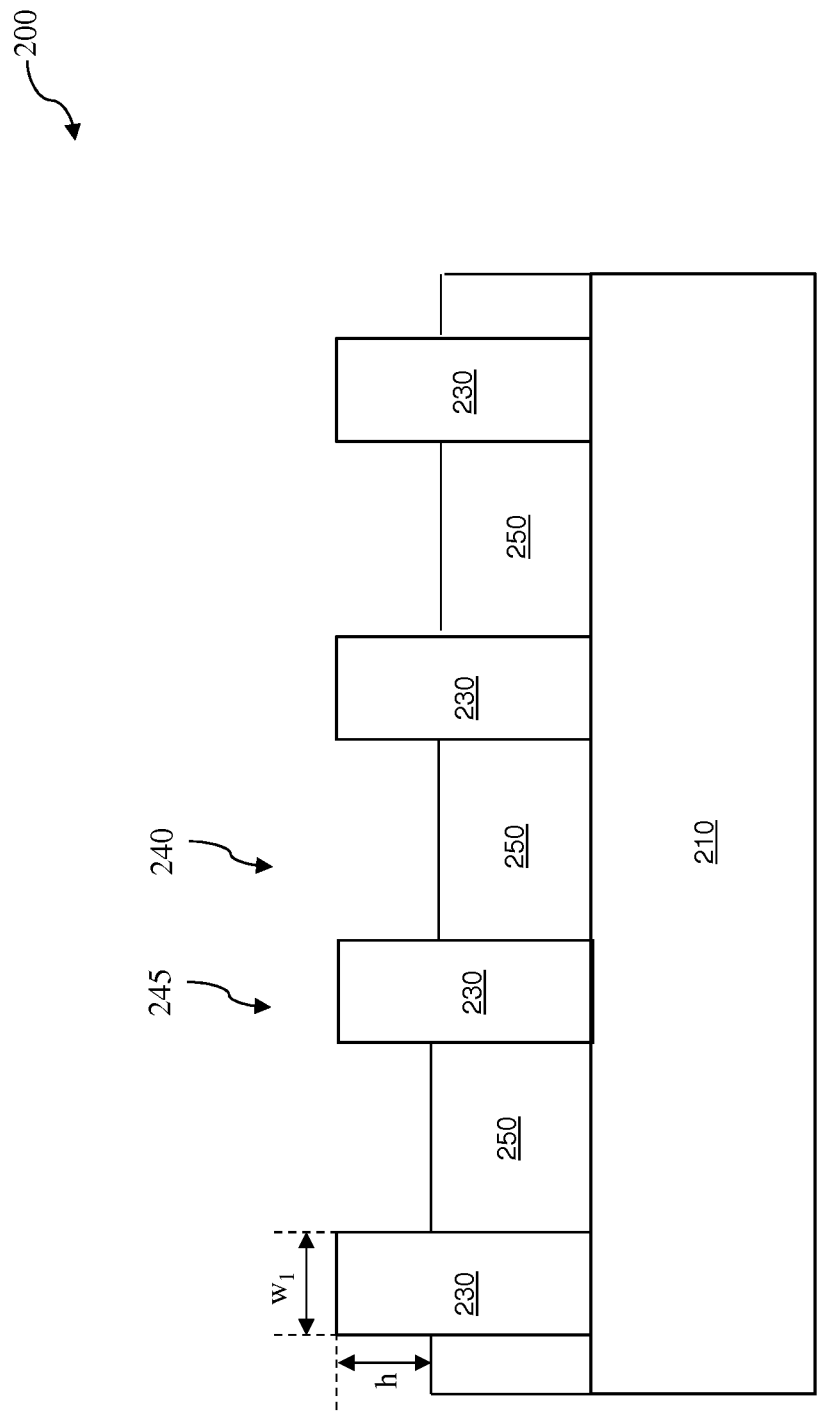

FIG. 3 illustrates an isolation feature 250 is formed between two adjacent first fin features 245 by filling in the trenches 240 with a dielectric layer and then etching back the dielectric layer to expose upper portions of the first fin feature 245. The isolation feature 250 may include silicon oxide, silicon nitride, silicon carbide, or other suitable material. In the present embodiment, the dielectric layer is etched back by a selective etch and thus the exposed upper portion of the first fin features 245 carries the first width $w_1$. The upper portion of the first fin feature 245 has a height h, which is designed as a height of a second fin feature to be formed.

Figure 4A:
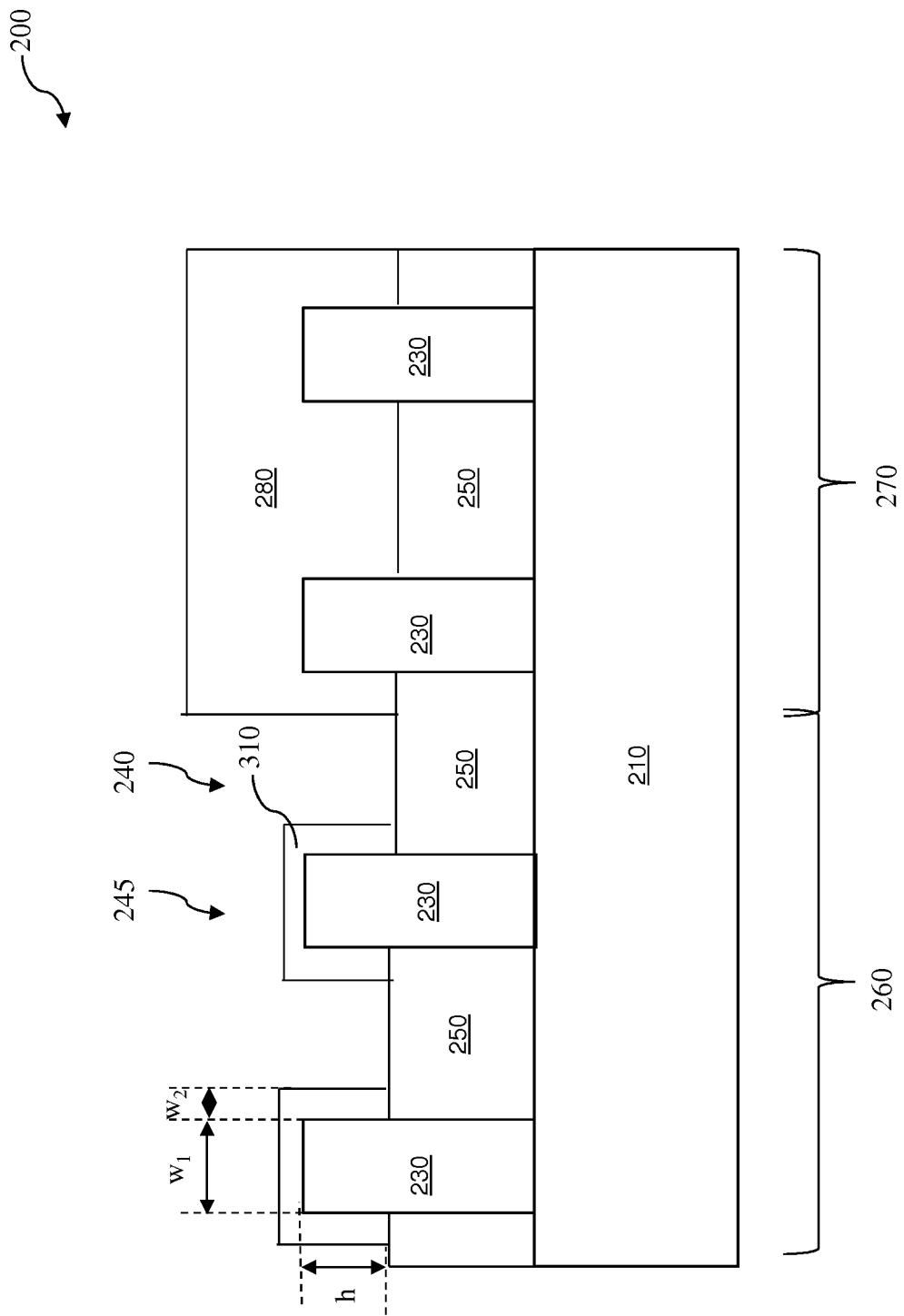

FIG. 4A illustrates the substrate 210 has a first region 260 and a second region 270. In the first region 260, a second semiconductor material layer 310 wraps over the exposed upper portion of the first fin feature 245. While in the second region 270, a first hard mask 280 covers the substrate 210, including the first fin feature 245. The second semiconductor material layer 310 may include Ge, Si, GaAs, AlGaAs, SiGe, GaAsP, GaSb, InSb, InGaAs, InAs, or other suitable materials. In the present embodiment, the second semiconductor material layer 310 is different than the first fin feature 245. For example, the first fin feature 245 is Si and the second semiconductor material 310 is SiGe. In one embodiment, the second semiconductor material layer 310 includes a single crystalline epitaxial semiconductor material. The second semiconductor material 310 is formed with a second width $w_2$ along sidewalls of the first fin feature 245. In one embodiment, the second width $w_2$ is smaller than the first width $w_1$. In one embodiment, the second width $w_2$ is half of the first width $w_1$. As an example, the first width $w_1$ is about 32 nm while the second width $w_2$ is about 16 nm. The first hard mask 280 may include dielectric material such as silicon oxide or silicon nitride. The first hard mask 280 may also include a patterned photoresist layer.

Figure 4B:
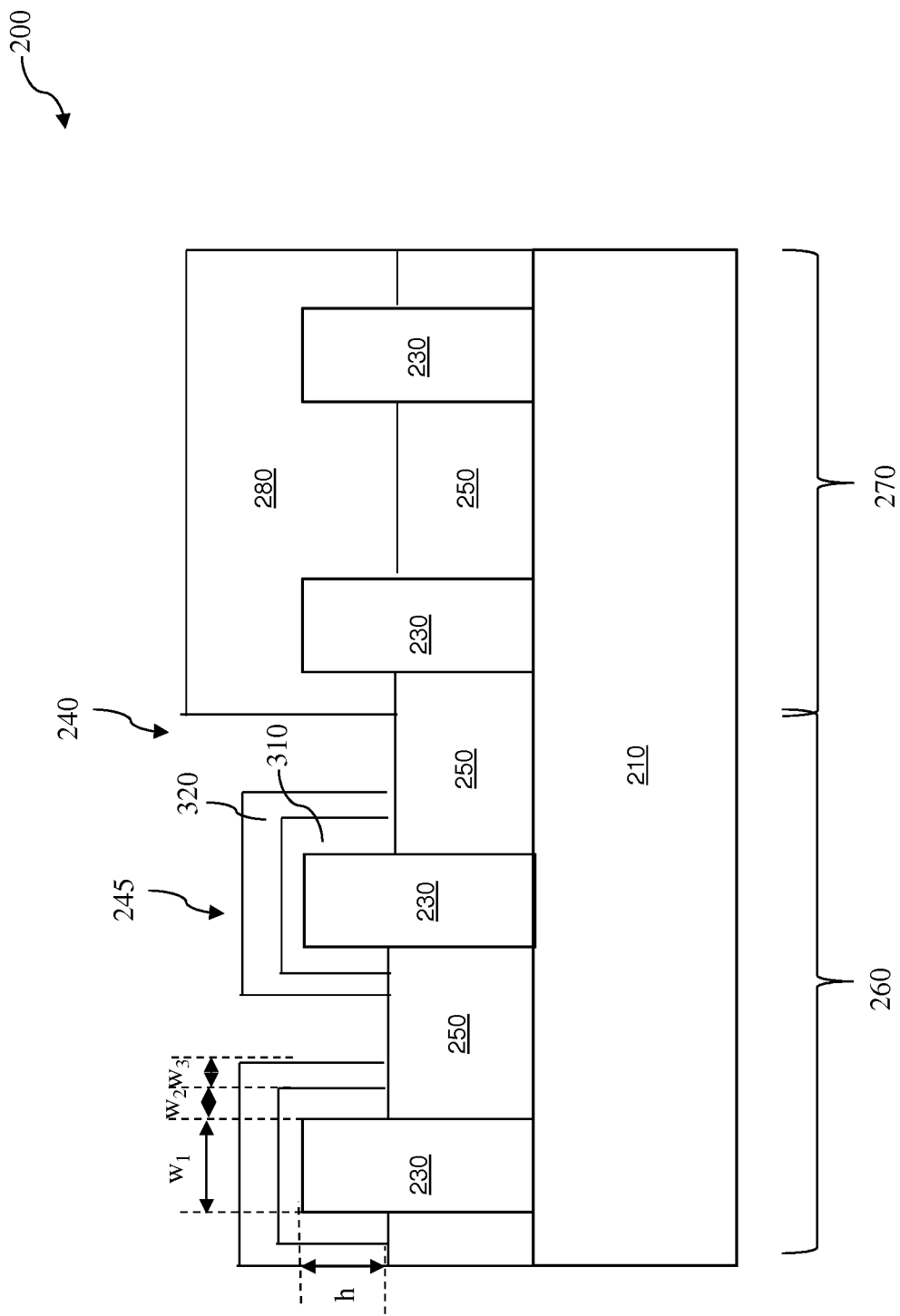

FIG. 4B illustrates, in the first region 260, a third semiconductor material layer 320 is formed over the second semiconductor material layer 310, with a third width $w_3$. In one embodiment, a sum of the second width $w_2$ and the third width $w_3$ is less than the first width $w_1$. The third semiconductor material layer 320 is different than the second semiconductor material layer 310. Throughout the description, when the third semiconductor layer 320 is referred to as having a composition different from the composition of the second semiconductor layer 310, it indicates that either one of the third semiconductor layer 320 and the second semiconductor layer 310 has an element not in the other layer, and/or one or more element that appears in both the third semiconductor layer 320 and the second semiconductor layer 310 has an atomic percentage in one of the third and the second layers, 320 and 310, different from the atomic percentage of the same element in the other layer. The second and third semiconductor material layers, 310 and 320, are different than the first fin feature 245.

Figure 5:
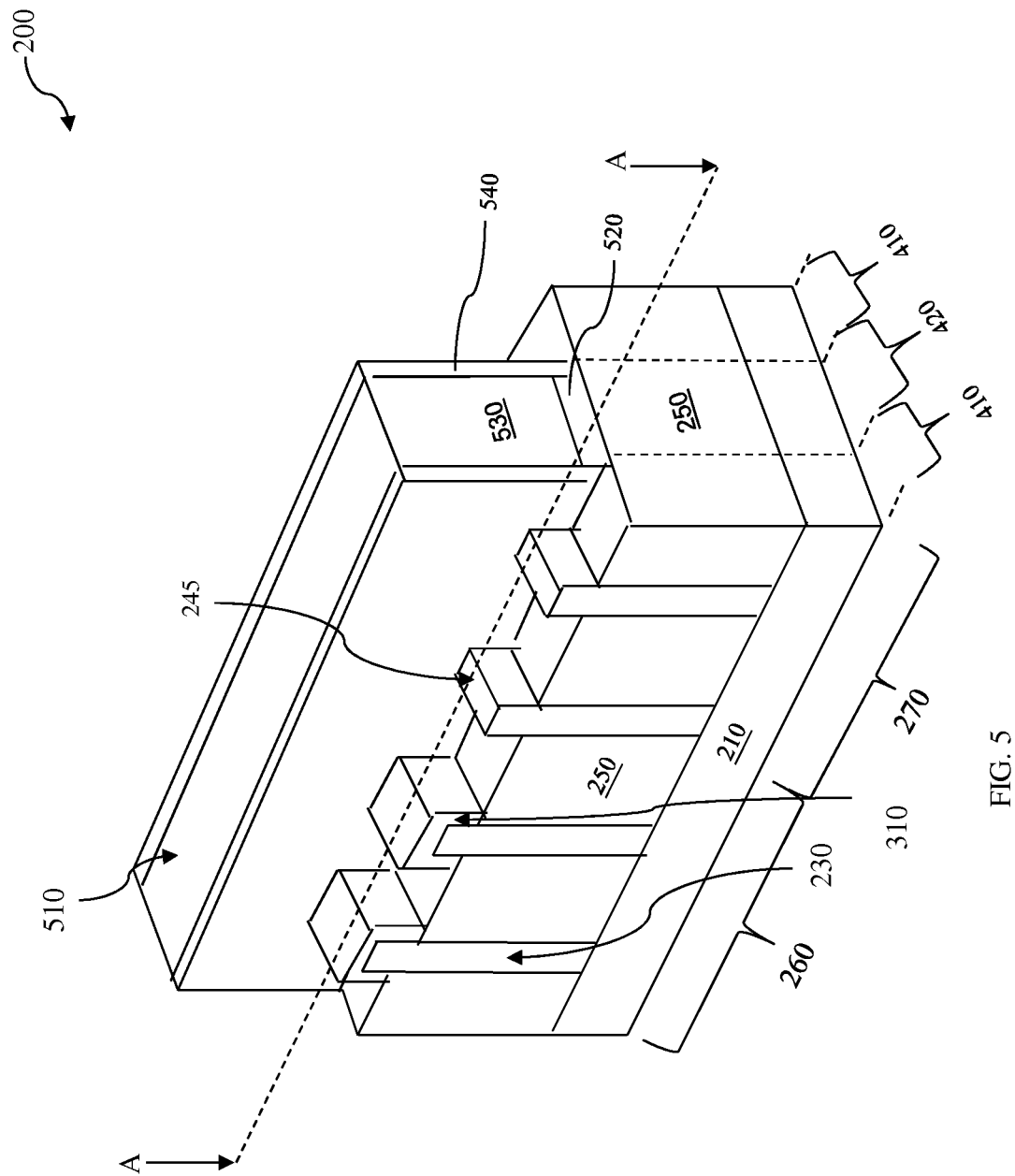
FIG. 5 is a diagrammatic perspective view of an example semiconductor device in accordance with some embodiments.

FIG. 5 illustrates, in some embodiments, the substrate 210 has source/drain regions 410 and a gate region 420. In some embodiments, a source/drain region 410 is a source region, and another source/drain region 410 is a drain region. The source/drain regions 410 are separated by the gate region 420.

One or more dummy gate stacks 510 are formed over in the gate region 420 in the substrate 210, including wrapping over a portion of the first fin features 245. The dummy gate stacks 510 are to be replaced later by a high-k (HK) and metal gate (MG) after high thermal temperature processes are performed, such as thermal processes during sources/drains formation. The dummy gate stack 510 may include a dummy gate dielectric layer 520 and a polysilicon layer 530.

Gate spacers 540 are formed along sidewalls of the dummy gate stacks 510. The gate spacers 540 may include a dielectric material such as silicon oxide, silicon nitride, silicon carbide, silicon oxynitride, or combinations thereof. Typical formation methods for the gate spacers 540 include depositing a gate spacer dielectric material over the gate stack and then anisotropically etching back the gate spacer dielectric material. The etching back process may include a multiple-step etching to gain etch selectivity, flexibility and desired overetch control.

Figure 6:
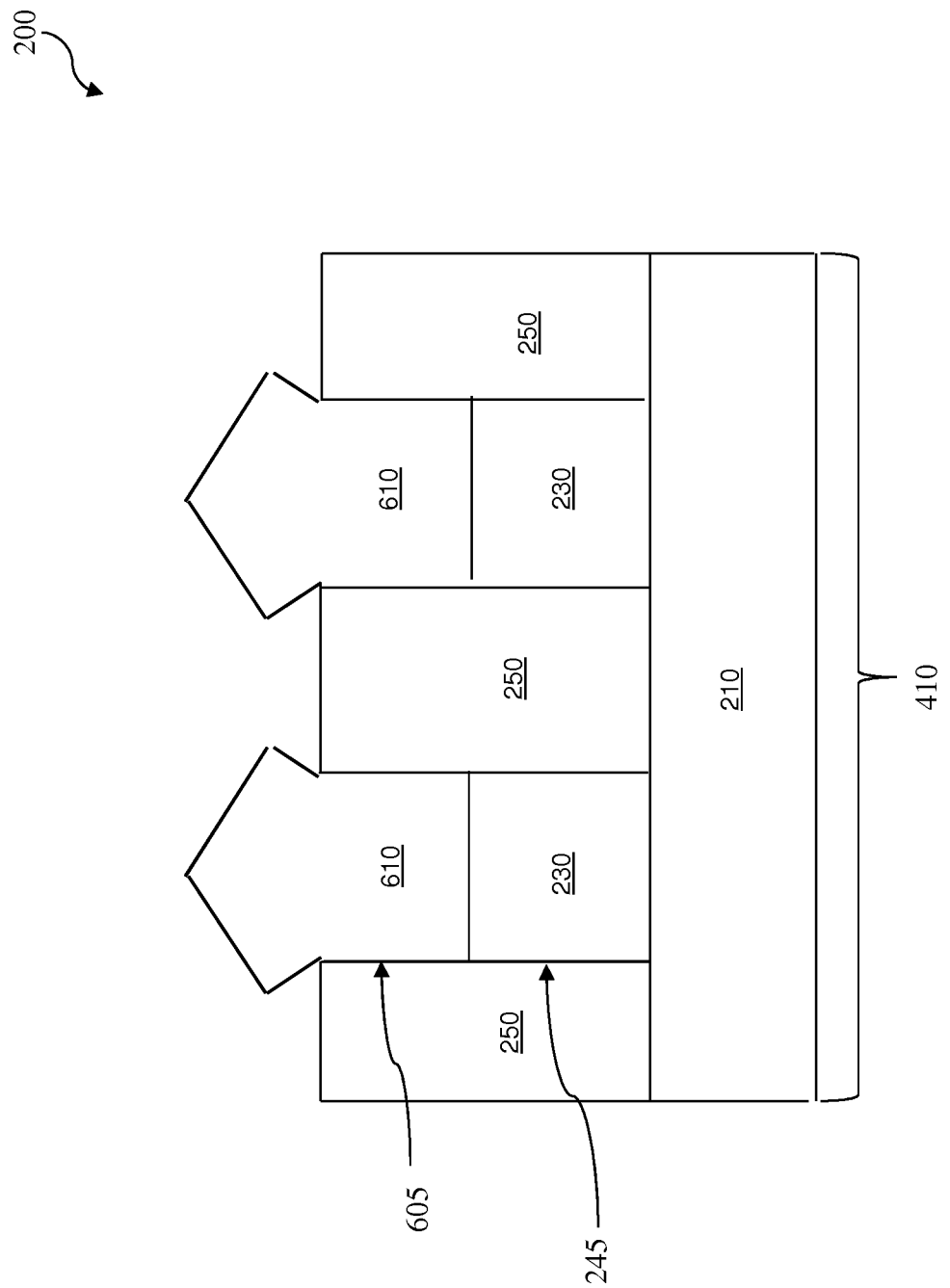
FIG. 6 is a cross-sectional view of an example semiconductor device along the line A-A in FIG. 5.

FIG. 6 illustrates a cross-section view of the semiconductor device 200 along line A-A in the S/D region 410 in FIG. 5. The first fin features 245 are recessed (as well as the second semiconductor material layer 310 are recessed) to form S/D trenches 605. S/D features 610 are formed on the recessed first fin feature 245 in the S/D trench 605. The S/D features 610 may include Ge, Si, GaAs, AlGaAs, SiGe, GaAsP, or other suitable materials. After the S/D trenches 605 are filled with the S/D feature 610, the further epitaxial growth of the top layer of the S/D feature 610 expands horizontally and facets may start to form, such as a diamond shape facets, as shown in FIG. 6. The S/D feature 610 may be in-situ doped during the epi processes. For example, in one embodiment, the S/D feature 610 includes an epitaxially grown SiGe layer that is doped with boron. In another embodiment, the S/D feature 610 includes an epitaxially grown Si epi layer that is doped with carbon. In yet another embodiment, the S/D feature 610 includes an epitaxially grown Si epi layer that is doped with phosphorous. In one embodiment, the S/D feature 610 is not in-situ doped, an implantation process (i.e., a junction implant process) is performed to dope the S/D feature 610.

Figure 7:
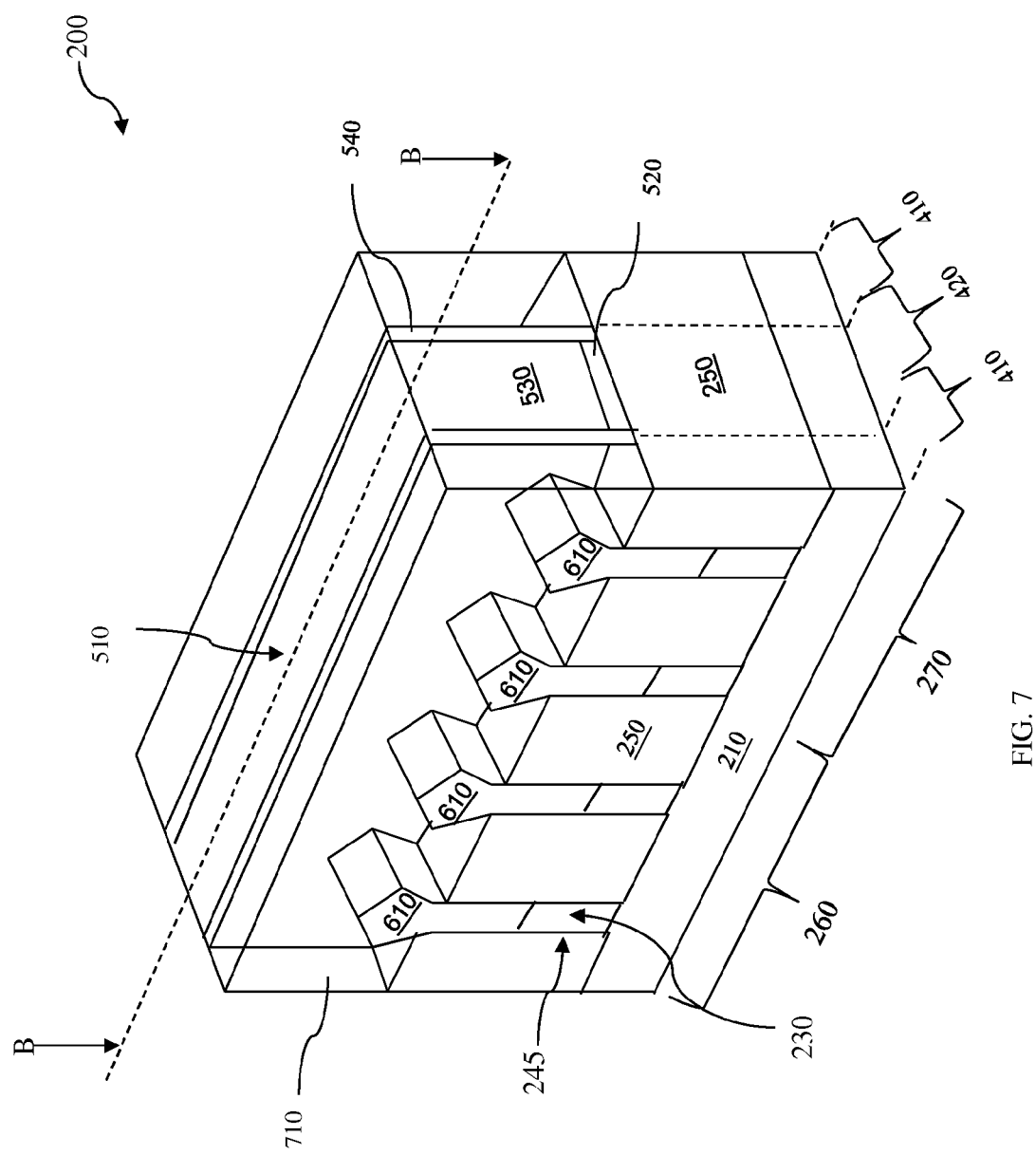
FIG. 7 is a diagrammatic perspective view of an example semiconductor device in accordance with some embodiments.

FIG. 7 illustrates an interlayer dielectric (ILD) layer 710 may be formed on the substrate 210, including between the dummy gate stacks 510. The ILD layer 710 may include silicon oxide, silicon nitride, a dielectric material having a dielectric constant (k) lower than thermal silicon oxide (therefore referred to as low-k dielectric material layer), or other suitable dielectric material layer. The ILD layer 710 includes a single layer or multiple layers. A chemical mechanical polishing (CMP) process may be performed to remove excessive ILD layer 710 and planarize the top surface of the ILD layer 710 with the dummy gate stack 510.

Figure 8:
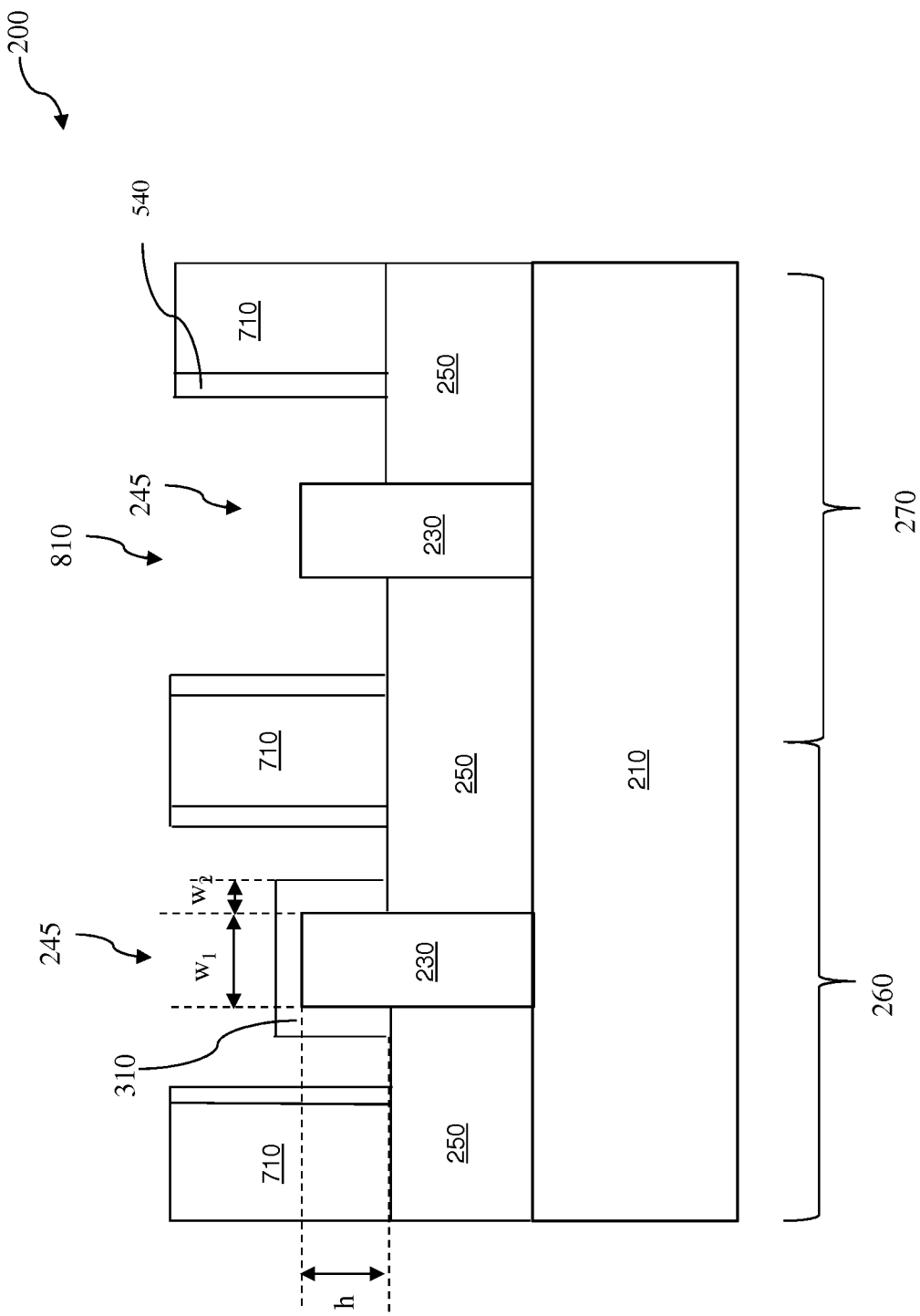
FIGS. 8-9, 10A-10B and 11A-11B are cross-sectional views of an example semiconductor device along the line B-B in FIG. 7.

FIG. 8 illustrates the dummy gate stacks 610 are removed to form a gate trench 810. In one embodiment, in the first region 260, the upper portion of the first fin feature 245 with the second semiconductor material layer 310 is exposed in the gate trench 810. While in the second region 270, the upper portion of the first fin feature 245 is exposed in the gate trench 810. In the present embodiment, the dummy gate stacks 610 is removed by a selective etching process, which does not substantially etch the first fin feature 245 and the second semiconductor material layer 310. In one embodiment, the first fin feature 245 has both the second and third semiconductor material layers, 310 and 320, thus the etches process removes dummy gate stacks 610 and the third semiconductor material layer 320 to form gate trench 810.

Figure 9:
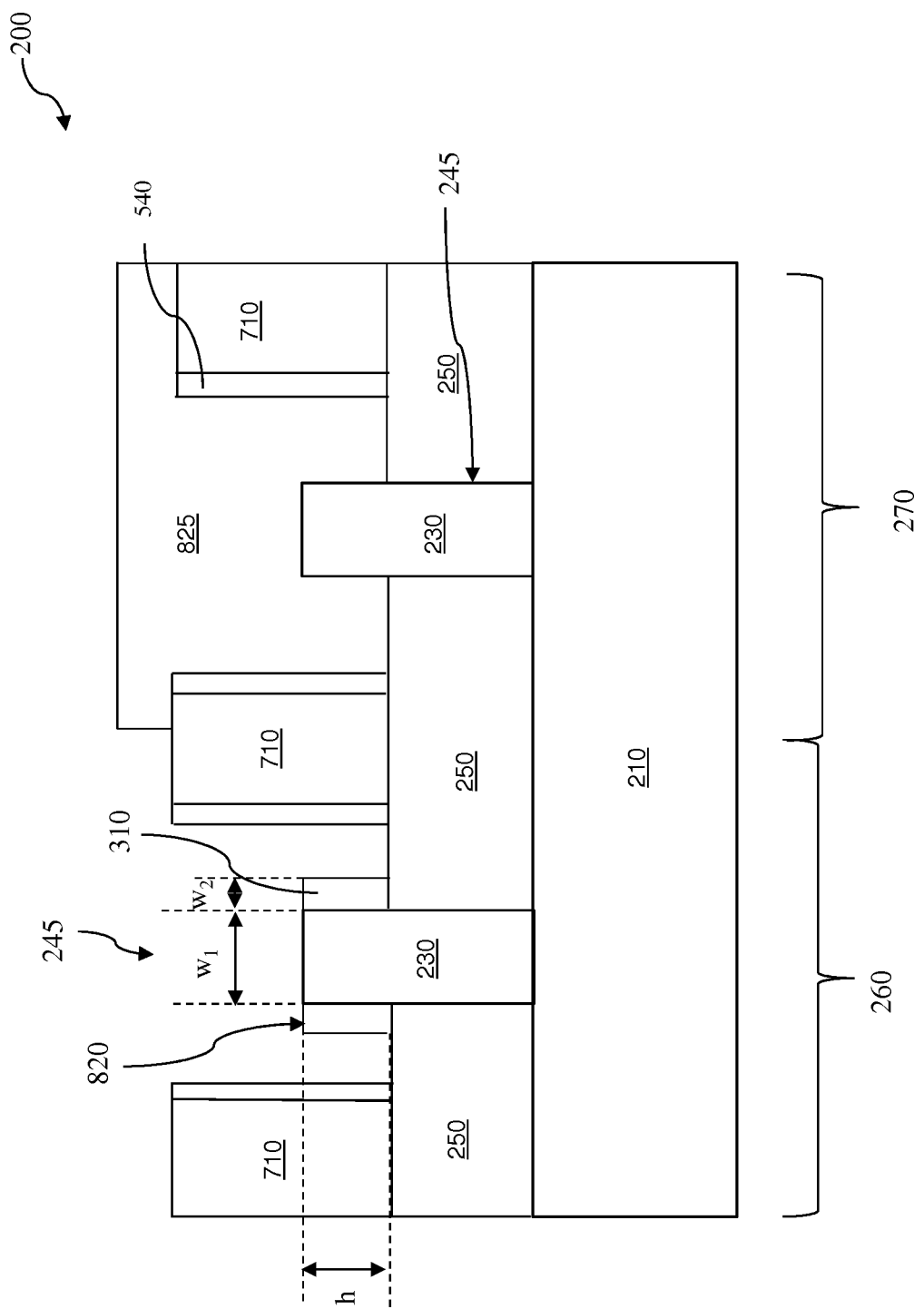

FIG. 9 illustrates, in the first region 260, the second semiconductor material layer 310 is recessed to expose a top surface of the first fin feature 245 while a second hard mask 825 protects the second region 270. Thus remaining second semiconductor material layer 310 forms the second spacer 820 along sidewall of the first fin feature 245. In one embodiment, the second semiconductor material layer 310 is recessed anisotropically and the second spacer 820 carries the second width $w_2$. The second hard mask 825 is similar in many respects to the first hard mask 280 discussed above in association with FIG. 4A.

Figure 10A:
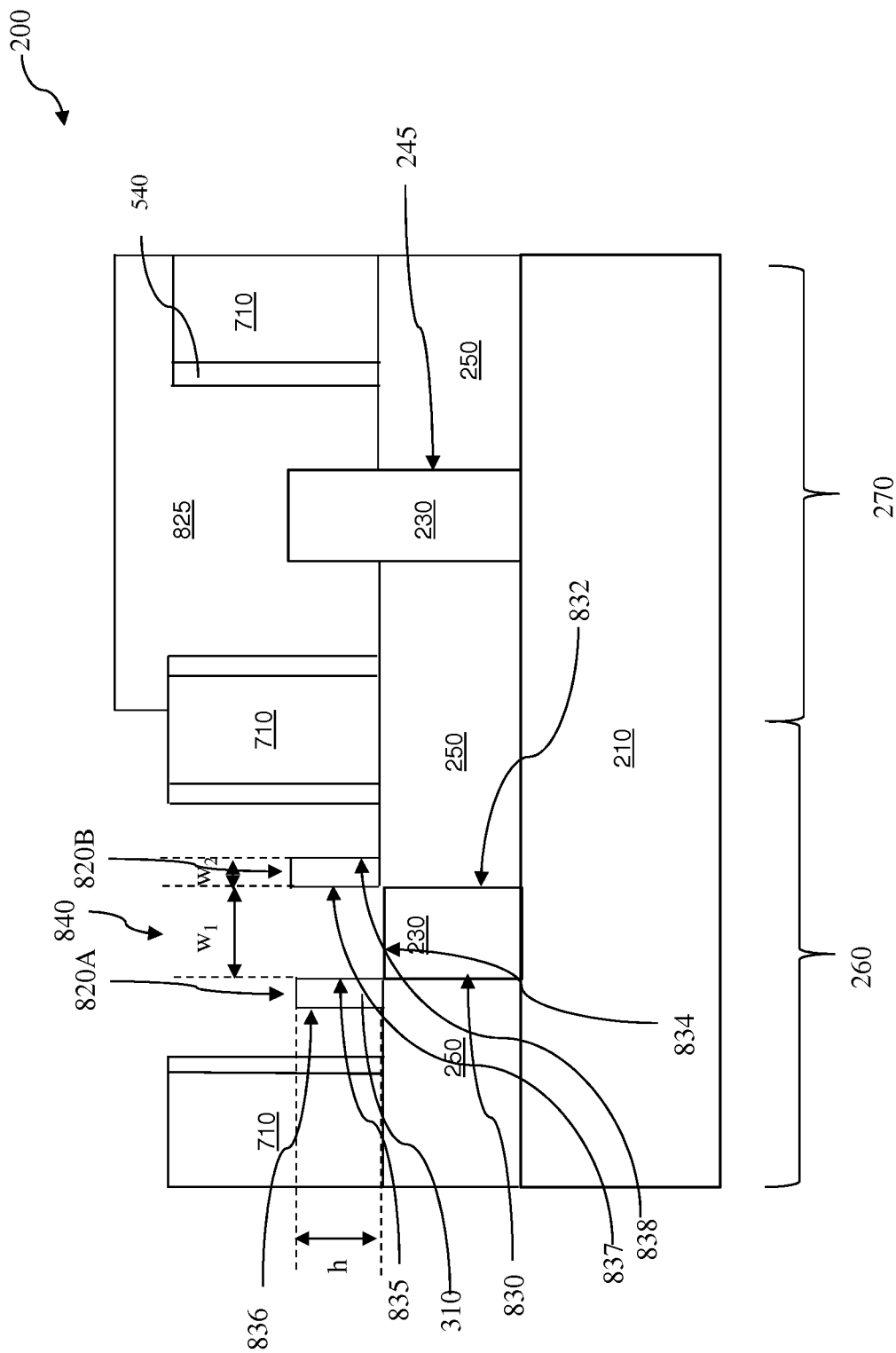

FIG. 10A illustrates, in the first region 260, the first fin feature 245 is recessed while the second spacer 820 remains intact. The second region 270 is protected by the second hard mask 825. In the present embodiment, the first fin feature 245 is recessed such that its top surface is at the same level as a bottom surface of the second spacer 820. The recessed first fin feature 245 is embedded within isolation structure 250 disposed over a semiconductor substrate, the recessed first fin structure 245 having a first sidewall 830 and a second opposing sidewall 832 and a top surface 834 extending from the first sidewall 830 to the second sidewall 832.

For the sake of clarity to better illustration of concepts of the present disclosure, the recessed first fin feature 245 in the first region 260 is referred to as embedded first fin feature 245E and the second spacers 820 at each side of the embedded first fin feature 245E are referred to as a second fin feature 820A and a third fin feature 820B.

The second and third fin features, 820A and 820B are disposed over the isolation structure 250. The second fin feature 820A has a third sidewall 835 and a fourth sidewall 836. The third sidewall 835 is aligned with the first sidewall 830 of the embedded first fin feature 245R while the fourth sidewall 836 is disposed directly over the isolation feature 250. The third fin feature 820B has a fifth sidewall 837 and a sixth sidewall 838. The fifth sidewall 837 is aligned with the second sidewall 832 of the embedded first fin feature 245R while the sixth sidewall 838 is disposed directly over the isolation feature 250. As has been mentioned previously, both of the second and third fin features, 820A and 820B, has the height h and the second width $w_2$. A spacing 840 is formed between the second and third fin features, 820A and 820B. The spacing 840 carries the first width $w_1$. Thus the second fin feature 820A is spaced apart from the third fin feature 820B such that the second and third fin features, 820A and 820B, do not physically contact each other.

Figure 10B:
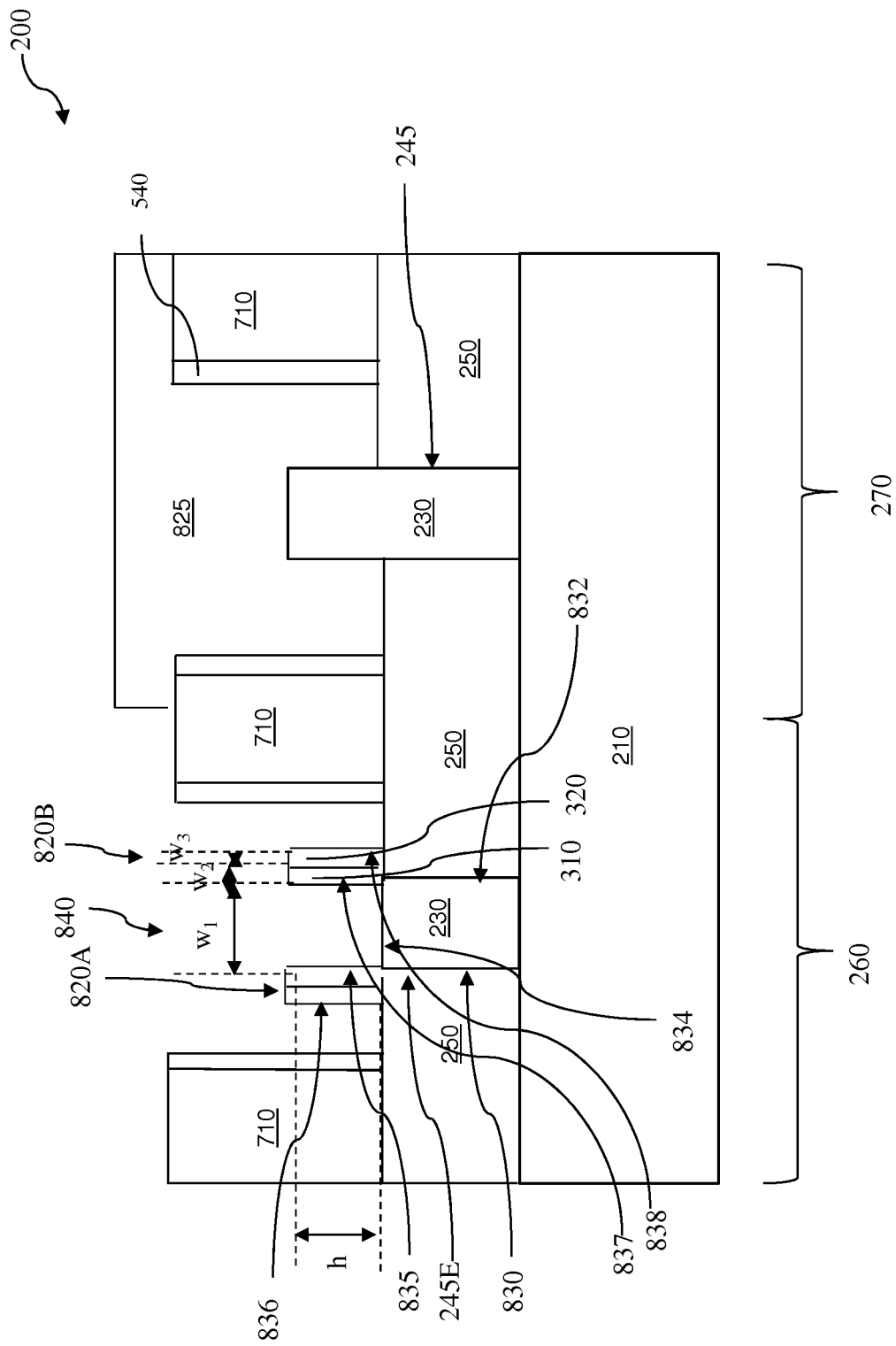

FIG. 10B illustrates an alternative embodiment when the first fin feature 245 has the second and third semiconductor material layer, 310 and 320 and are not removed by the etching process discussed above with respect to FIG. 8. In this embodiment, the dummy gate stacks 610 was removed by a selective etching process, which did not substantially etch the first fin feature 245 and the third semiconductor material layer 320. Thus, when the second and third fin features, 820A and 820B are formed, each of them has first section of the second semiconductor layer 310, which parallels to a second section with the third semiconductor layer 320.

Figure 11A:
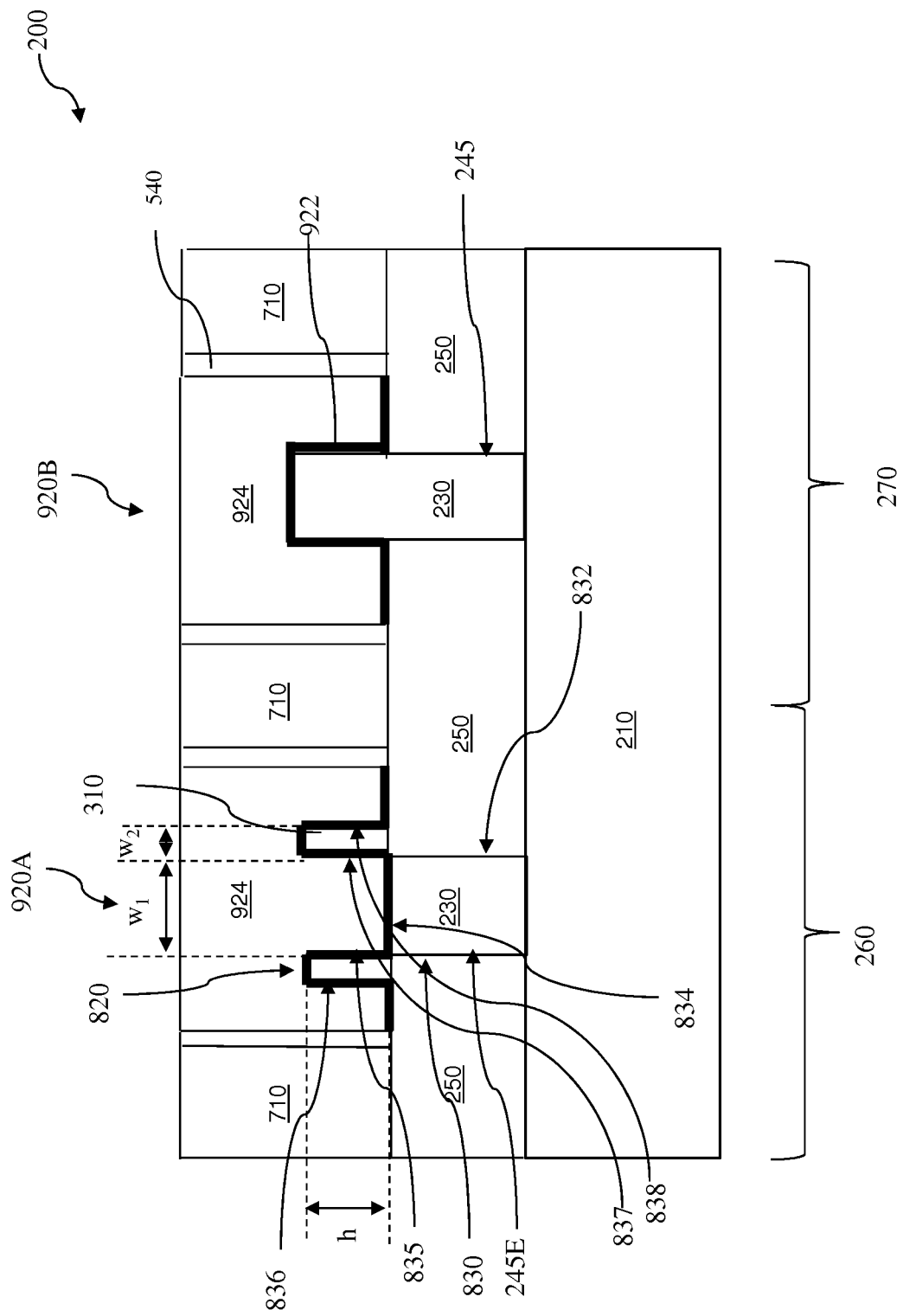

FIG. 11A illustrate high-k/metal gates (HK/MGs) 920 are formed over the substrate 210, including wrapping over the second and the third fin features, 820A and 820B, in the first region and the first fin feature 245 in the second region. The HK/MG 920 include gate dielectric layer 922 and gate electrode 924 over the gate dielectric. The gate dielectric layer 922 is disposed directly on the top surface 834 of the embedded first fin structure 245E, the third sidewall 835 and fourth sidewall 836 of the second fin feature 820A and the fifth sidewall 837 and the sixth sidewall 838 of the third fin feature 820B. The gate electrode 924 is disposed over the gate dielectric layer 922.

The gate dielectric layer 922 may include an interfacial layer (IL) and a HK dielectric layer deposited on the IL. The IL may include oxide, HfSiO and oxynitride. The HK dielectric layer may include LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), or other suitable materials.

The gate electrodes 924 may include a single layer or alternatively a multilayer structure, such as various combinations of a metal layer with a work function to enhance the device performance (work function metal layer), liner layer, wetting layer, adhesion layer and a conductive layer of metal, metal alloy or metal silicide). The MG electrode 516 may include Ti, Ag, Al, TiAlN, TaC, TaCN, TaSiN, Mn, Zr, TiN, TaN, Ru, Mo, Al, WN, Cu, W, any suitable materials or a combination thereof. A CMP process may be performed to remove excessive MG electrode 924.

In the first region 260, the HK/MG 920 is referred to as HK/MG 920A. The MG electrode 924 fills in space between the second and third fin features, 820A and 820B, and connects them. In the second region, the HK/MG 920 wraps over the first fin feature 245, referred to as HK/MG 920B. To meet semiconductor device 200 performance needs, in one embodiment, one HK/MG 920A is next to another HK/MG 920A and in another embodiment, one HK/MG 920A is next to one HK/MG 920B.

Figure 11B:
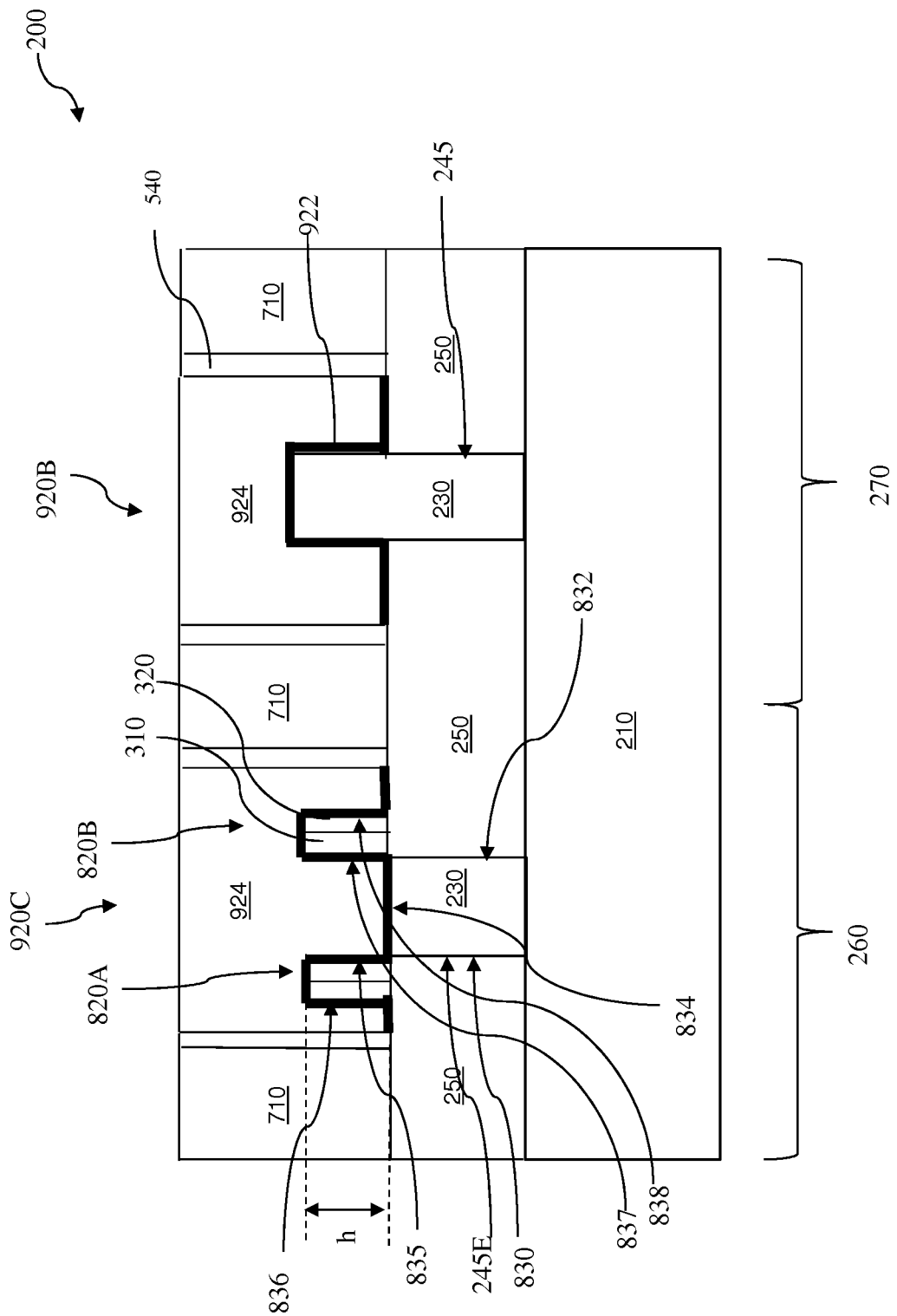

FIG. 11B illustrate the embodiment in which second and the third fin features, 820A and 820B, include the second and the third semiconductor material layers, 310 and 320. In this case, high-k/metal gates (HK/MGs) 920 are formed over the substrate 210, including wrapping over the second and third fin features, 820A and 820B, in the first region and the first fin feature 245 in the second region. The HK/MG 920 in the first region 260 is referred to as HK/MG 920C.

To meet semiconductor device 200 performance needs, HK/MGs 920 may have various combinations among HK/MG 920A, 920B and 920C. In one embodiment, one HK/MG 920A is next to another HK/MG 920A. In another embodiment, one HK/MG 920A is next to one HK/MG 920B. In yet another embodiment, one HK/MG 920C is next to another HK/MG 920C. In yet another embodiment, one HK/MG 920C is next to one HK/MG 920B.

Figure 12:
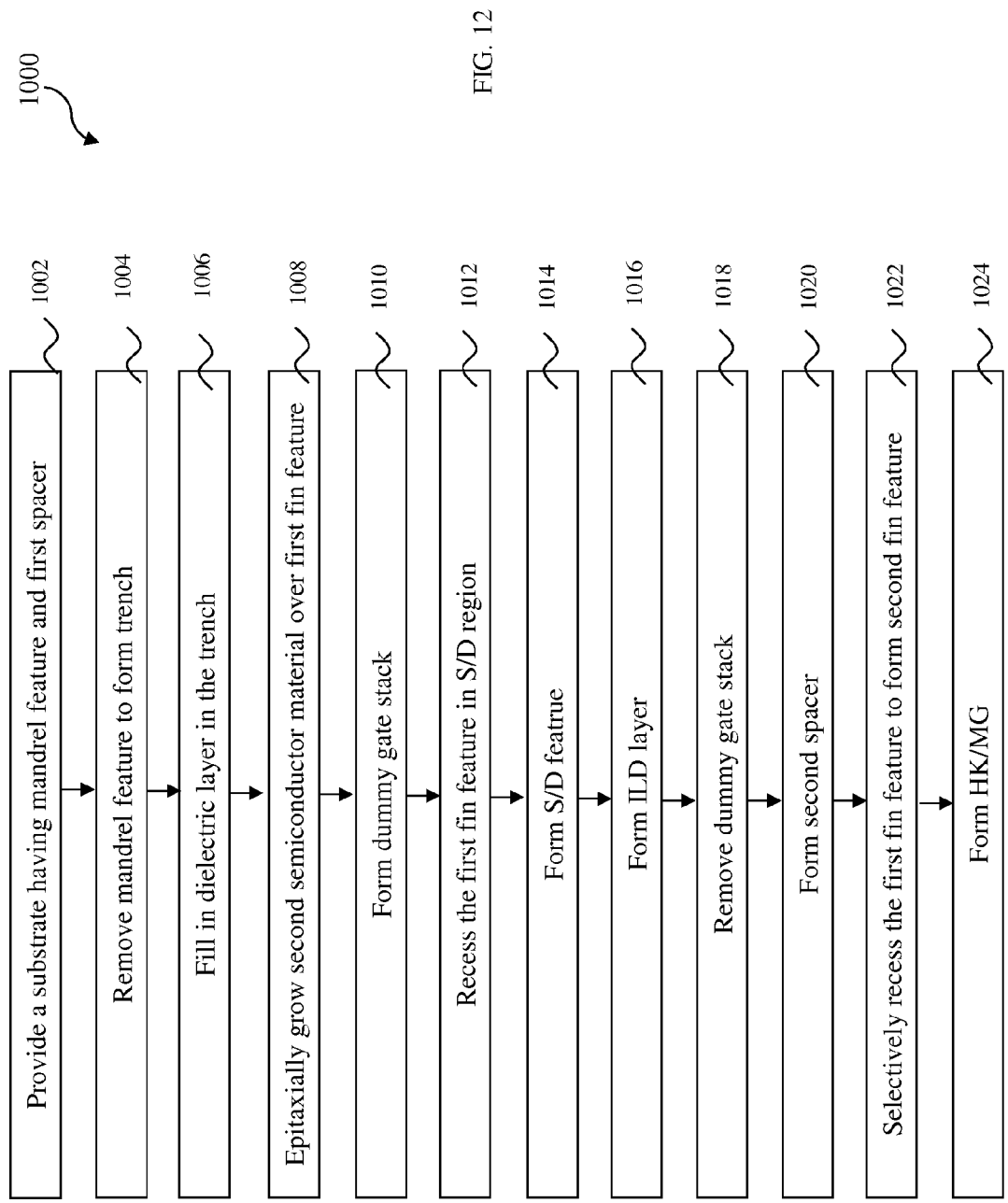
FIG. 12 is a flow chart of an example method for fabricating a semiconductor device in accordance with some embodiments.

The present disclosure also provides various methods for fabricating a semiconductor device. FIG. 12 is a flowchart of a method 1000 for fabricating the semiconductor device 200 (in FIGS. 11A and 11B in the present embodiment). Referring to FIGS. 12 and 1, the method 1000 starts at step 1002 by providing the substrate 210 having the mandrel features 220 and the first spacer 230 along sidewalls of the mandrel features 220.

Referring to FIGS. 12 and 2, the method 1000 proceeds to step 1004 by removing the mandrel features 220 to form the trench 240. The mandrel features 220 are removed by an etch process that selectively removes the mandrel feature 220 but substantially does not etch the first spacer 230. The selective etch may include a selective wet etch, a selective dry etch, and/or a combination thereof. The first spacer 230 is referred to as the first fin feature 245.

Referring to FIGS. 12 and 3, the method 1000 proceeds to step 1006 by filling in the trenches 240 with the isolation feature 250 and recessing the isolation feature 250 to expose the upper portion of the first fin feature 245. The isolation feature 250 is formed by a suitable technique, such as CVD, and etched back by a selective etch including a selective wet etch, a selective dry etch, and/or a combination thereof.

Referring to FIGS. 12 and 4A-4B, the method 1000 proceeds to step 1008 by epitaxially growing the second semiconductor material layer 310 to wrap over the upper portion of the first fin feature 245 in the first region 260. In one embodiment, a first hard mask 280 is formed to cover the second region 270. The first hard mask 280 may be formed by deposition, patterning and etching process. The epitaxial process may include CVD VPE and/or UHV-CVD, molecular beam epitaxy, and/or other suitable processes. In one embodiment, the third semiconductor material layer 320 is deposited over the second semiconductor material layer 310 by another epitaxially growing process. Thereafter, the first hard mask 280 is removed by a suitable etching process.

Referring to FIGS. 12 and 5, the method 1000 proceeds to step 1010 by forming the dummy gate stack 510 and the gate spacer 540 over the portion of the first fin feature 245 in the gate region 420. The dummy gate stack 510 is formed by any suitable process or processes. For example, the dummy gate stack 510 can be formed by a procedure including deposition, photolithography patterning, and etching processes. The deposition processes include CVD, physical vapor deposition (PVD), ALD, other suitable methods, and/or combinations thereof. The etching processes include dry etching, wet etching, and/or other etching methods.

Referring to FIGS. 12 and 6, the method 1000 proceeds to step 1012 by selectively recessing the first fin feature 245 in the S/D region 410, as well as the second semiconductor material layer 310, to form the S/D trench 605. The recessing process may include dry etching process, wet etching process, and/or combination thereof. The recessing process may also include a selective wet etch or a selective dry etch. A wet etching solution includes a tetramethylammonium hydroxide (TMAH), a $HF/HNO_3/CH_3COOH$ solution, or other suitable solution. The dry and wet etching processes have etching parameters that can be tuned, such as etchants used, etching temperature, etching solution concentration, etching pressure, source power, RF bias voltage, RF bias power, etchant flow rate, and other suitable parameters. For example, a wet etching solution may include $NH_4OH$, KOH (potassium hydroxide), HF (hydrofluoric acid), TMAH (tetramethylammonium hydroxide), other suitable wet etching solutions, or combinations thereof. Dry etching processes include a biased plasma etching process that uses a chlorine-based chemistry. Other dry etchant gasses include $CF_4$, $NF_3$, $SF_6$, and He. Dry etching may also be performed anisotropically using such mechanisms as DRIE (deep reactive-ion etching).

Referring again to FIGS. 12 and 6, the method 1000 proceeds to step 1014 by forming the S/D feature 610 in the S/D trenches 605. The S/D feature 610 may be formed by epitaxial growing processes, such as CVD, VPE and/or UHV-CVD, molecular beam epitaxy, and/or other suitable processes. In one embodiment, an in-situ doping process may be performed during the epi processes. In another embodiment, an implantation process (i.e., a junction implant process) is performed to dope the S/D feature 610. One or more annealing processes may be performed to activate dopants. The annealing processes comprise rapid thermal annealing (RTA) and/or laser annealing processes.

Referring to FIGS. 12 and 7, the method 1000 proceeds to step 1016 by forming the ILD layer 710 over the substrate 210. The ILD layer 710 may be deposited by CVD, PV, ALD, spin-on, and/or other suitable processes. A CMP process may be performed to remove excessive ILD layer 710 and planarize the top surface of the ILD layer 710 with the dummy gate stack 510.

Referring to FIGS. 12 and 8, the method 1000 proceeds to step 1018 by removing the dummy gate stack 510 to form the gate trench 810. In one embodiment, the dummy gate stack 510 is removed by a selective wet etch, or a selective dry etch. In another embodiment, the dummy gate stack 510 is removed by lithography patterning and etching processes.

Referring to FIGS. 12 and 9, the method 1000 proceeds to step 1020 by recessing the second semiconductor material layer 310 to form the second spacer 820. In the present embodiment, the second semiconductor material layer 310 is recessed by an anisotropic and selective dry etch, which selectively removes the portion of the second semiconductor material layer 310 to expose the top surface to the first fin feature 245, but not laterally etches the second semiconductor material layer 310 along sidewall of the first fin feature 245 and the first fin feature 245.

Referring to FIGS. 12 and 10A and 10B, the method 1000 proceeds to step 1022 by selectively recessing the upper portion of the first fin feature 245 to form the spacing 840, the second and third fin features, 820A and 820B. In one embodiment, the upper portion of the first fin feature 245 is recessed by a selective dry etching process, which does not substantially etching the second and third fin features, 820A and 820B.

Referring to FIGS. 12 and 11A-11B, the method 1000 proceeds to step 1024 by forming the HK/MG 920 over the substrate 210, including wrapping over the second and third fin features, 820A and 820B, in the first region 260 and the first fin feature 245 in the second region 270. The gate dielectric layer 922 is deposited over the gate trench 810 by a suitable method, such as ALD, CVD, thermal oxidation or ozone oxidation, other suitable technique, or a combination thereof. The MG electrode 924 may be formed by ALD, PVD, CVD, or other suitable process. Another CMP process may be performed to remove excessive gate dielectric layer 922 and the MG electrode 924.

Additional steps can be provided before, during, and after the method 1000, and some of the steps described can be replaced, eliminated, or moved around for additional embodiments of the method 1000.

The semiconductor device 200 may include additional features, which may be formed by subsequent processing. For example, various contacts/vias/lines and multilayers interconnect features (e.g., metal layers and interlayer dielectrics) are formed over the substrate 210. For example, a multilayer interconnection includes vertical interconnects, such as conventional vias or contacts, and horizontal interconnects, such as metal lines. The various interconnection features may implement various conductive materials including copper, tungsten, and/or silicide. In one example, a damascene and/or dual damascene process is used to form a copper related multilayer interconnection structure.

Based on the above, it can be seen that the present disclosure offers a first, second and the third fin structures with different width and semiconductor material in respective region of the semiconductor device, and a method for fabricating them. The first fin feature has a larger width and contacts to the substrate while the second fin feature has a smaller width and isolated from the substrate by a dielectric layer. The semiconductor device with first, second and the third fin features demonstrates high performance and low current leakage, especially for small dimension devices, such as static random-access memory (SRAM) device and short-channel (SC) logic device. The method provides a robust small dimension fin feature formation process.

The present disclosure provides many different embodiments of a semiconductor device. The semiconductor device includes a first fin feature embedded within an isolation structure disposed over a semiconductor substrate, the first fin structure having a first sidewall and a second opposing sidewall and a top surface extending from the first sidewall to the second sidewall. The device also includes a second fin feature disposed over the isolation structure and having a third sidewall and a fourth sidewall. The third sidewall is aligned with the first sidewall of the first fin structure. The device also includes a gate dielectric layer disposed directly on the top surface of the first fin structure, the third sidewall and the fourth sidewall of the second fin feature and a gate electrode disposed over the gate dielectric.

In another embodiment, a semiconductor device includes a first semiconductor fin feature over a substrate, a recessed first semiconductor fin feature embedded with in an isolation structure disposed over the substrate. The device also includes a second semiconductor fin feature disposed over the isolation structure and having a third sidewall and a fourth sidewall. The third sidewall is aligned with the first sidewall of the first fin structure and the fourth sidewall is disposed directly over the isolation feature. The device also includes a third semiconductor fin feature disposed over the isolation structure and having a fifth sidewall and a sixth sidewall. The fifth sidewall is aligned with the second sidewall of the first semiconductor fin structure and the sixth sidewall is disposed directly over the isolation feature. The device also includes a gate stack disposed over the substrate, including wrapping over the first semiconductor fin features. The device also includes another gate stack disposed over the substrate, including wrapping over the second semiconductor fin features and the third semiconductor fin feature.

In yet another embodiment, a method for fabricating a semiconductor device includes forming first fin features over a substrate, forming isolation region between first fin feature that an upper portion of the first fin feature is above the isolation region, epitaxially growing a semiconductor layer over the upper portion of the first fin feature, forming dummy gate stacks over a portion of the first fin feature having the semiconductor material layer, recessing the first fin feature beside the dummy gate stack to form source/drain (S/D) recess, forming S/D feature over the S/D recess, removing dummy gate stack to expose the first fin feature with the semiconductor material layer, recessing the semiconductor material layer to expose a top surface of the first fin feature and leaving the semiconductor material layer along sidewall of the first fin feature and selectively removing the upper portion of the first feature while leaving the semiconductor material layer intact to form a second fin feature and a third fin feature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
a first fin feature embedded within an isolation structure disposed over a semiconductor substrate, the first fin feature having a first sidewall and a second opposing sidewall and a top surface extending from the first sidewall to the second sidewall;
a second fin feature disposed over the isolation structure and having a third sidewall and a fourth sidewall, wherein the third sidewall is substantially aligned with the first sidewall of the first fin feature;
a third fin feature disposed over the isolation structure and having a fifth sidewall, wherein the fifth sidewall is substantially aligned with the second sidewall of the first fin feature, wherein the first fin feature is formed of a first semiconductor material and both the second and third fin features are formed of a second semiconductor material that is different than the first semiconductor material;
a gate dielectric layer disposed directly on the top surface of the first fin feature and the third sidewall and the fourth sidewall of the second fin feature; and
a gate electrode disposed over the gate dielectric layer.

2. The device of claim 1, wherein the fourth sidewall is disposed directly over the isolation structure.

3. The device of the claim 1, wherein the second semiconductor material includes a single crystalline epitaxial semiconductor material.

4. The device of claim 1, wherein the second fin feature is spaced apart from the third fin feature such that the second and third fin features do not physically contact each other.

5. The device of claim 1, wherein the gate dielectric layer is disposed directly on the fifth sidewall of the third fin feature.

6. The device of the claim 1, wherein the second fin feature has a same width as the third fin feature, which is smaller than a width of the first fin feature.

7. The device of the claim 1, wherein the second fin feature includes a first section, which parallels to a second section, wherein a semiconductor material of the first section is different than a semiconductor material in the second section.

8. The device of the claim 7, wherein a sum of a width of the first section and a width of the second section is less than a width of the first fin feature.

9. A semiconductor device comprising:
   a first semiconductor fin feature disposed over a substrate;
   a recessed first semiconductor fin feature embedded within an isolation structure disposed over the substrate, the recessed first semiconductor fin feature having a first sidewall and an opposing second sidewall;
   a second semiconductor fin feature disposed over the isolation structure without being embedded in the isolation structure, the second semiconductor fin feature having a third sidewall and an opposing fourth sidewall, wherein the third sidewall is substantially aligned with the first sidewall of the recessed first semiconductor fin feature, wherein the fourth sidewall is disposed directly over the isolation structure, wherein a bottom surface of the second semiconductor fin feature extends from the third sidewall to the fourth sidewall, the entire bottom surface of the second semiconductor fin feature physically contacting the isolation structure;
   a third semiconductor fin feature disposed over the isolation structure and having a fifth sidewall and a sixth sidewall, wherein the fifth sidewall is substantially aligned with the second sidewall of the recessed first semiconductor fin feature, wherein the sixth sidewall is disposed directly over the isolation structure;
   a gate stack disposed over the substrate, including wrapping around the first semiconductor fin feature; and
   another gate stack disposed over the substrate, including wrapping around the second semiconductor fin feature and the third semiconductor fin feature.

10. The device of claim 9, wherein the first semiconductor fin feature is formed of a first semiconductor material and both the second and third semiconductor fin features are formed of a second semiconductor material that is different than the first semiconductor material.

11. The device of claim 9, wherein the second semiconductor fin feature is spaced apart from the third semiconductor fin feature such that the second and third fin features do not physically contact each other.

12. The device of claim 9, wherein a gate dielectric layer of the gate stack is disposed directly on a top surface of the recessed first semiconductor fin feature, the third sidewall and the fourth sidewall of the second semiconductor fin feature, and the fifth and sixth sidewalls of the third semiconductor fin feature.

13. The device of the claim 9, wherein the second semiconductor fin feature has a same width as the third semiconductor fin feature, which is smaller than a width of the first semiconductor fin feature.

14. The device of the claim 9, wherein the second semiconductor fin feature includes a first section, which parallels to a second section, wherein a semiconductor material of the first section is different than a semiconductor material in the second section.

15. The device of the claim 9, further comprising:
    source/drain features over the substrate, beside the gate stack.

16. A method for fabricating a semiconductor device, the method comprising:
    forming first fin features over a substrate;
    forming an isolation region between the first fin features that an upper portion of the first fin features is above the isolation region;
    epitaxially growing a semiconductor layer directly on the first fin features such that the semiconductor layer physically contacts the first fin features;
    after epitaxially growing the semiconductor layer directly on the first fin features, forming a gate dielectric layer and a gate electrode layer over the semiconductor layer on the first fin features;
    removing the gate dielectric layer and the gate electrode layer to expose the semiconductor layer on the first fin features;
    recessing the semiconductor layer to expose a top surface of the first fin features while leaving the semiconductor layer along respective sidewalls of the first fin features; and
    selectively removing the upper portion of the first fin features while leaving the semiconductor layer substantially intact to form a second fin feature and a third fin feature.

17. The method of claim 16, further comprising forming a high-k/metal gate (HK/MG) stack over the substrate, including wrapping around the second and third fin features.

18. The method of claim 16, wherein forming the first fin features over the substrate includes:
    forming mandrel features over the substrate;
    depositing a material layer over the mandrel features;
    anisotropically etching the material layer to form spacers along sidewall of the mandrel features; and
    selectively removing the mandrel features while leaving the spacers substantially intact to form the first fin features.

19. The device of claim 1, wherein the first fin feature physically contacts the semiconductor substrate, and
    wherein a bottom surface of the second fin feature extends from the third sidewall to the fourth sidewall, and
    wherein the isolation structure physically contacts the entire bottom surface of the second fin feature.

20. The device of claim 1, wherein the third fin feature includes a sixth sidewall opposing the fifth sidewall,
    wherein a bottom surface of the third fin feature extends from the fifth sidewall to the sixth sidewall, and
    wherein the isolation structure physically contacts the entire bottom surface of the third fin feature.

* * * * *